United States Patent

Kornachuk et al.

[11] Patent Number: 5,889,715
[45] Date of Patent: Mar. 30, 1999

[54] VOLTAGE SENSE AMPLIFIER AND METHODS FOR IMPLEMENTING THE SAME

[75] Inventors: Steve P. Kornachuk; Scott T. Becker, both of San Jose, Calif.

[73] Assignee: Artisan Components, Inc., Sunnyvale, Calif.

[21] Appl. No.: 839,151

[22] Filed: Apr. 23, 1997

[51] Int. Cl.[6] .................................................. G11C 7/02
[52] U.S. Cl. ........................ 365/207; 365/205; 365/208; 365/233
[58] Field of Search ................................. 365/207, 205, 365/208, 230.03, 233, 206

[56] References Cited

U.S. PATENT DOCUMENTS

| | | | |
|---|---|---|---|
| 4,128,900 | 12/1978 | Lappington | 365/94 |
| 5,029,135 | 7/1991 | Okubo | 365/203 |
| 5,091,889 | 2/1992 | Hamano et al. | 365/233.5 |
| 5,146,427 | 9/1992 | Sasaki et al. | 365/189.05 |
| 5,214,609 | 5/1993 | Kato et al. | 365/230.01 |
| 5,311,471 | 5/1994 | Matsumoto et al. | 365/189.05 |
| 5,404,334 | 4/1995 | Pascucci et al. | 365/210 |
| 5,414,663 | 5/1995 | Komarek et al. | 365/210 |
| 5,459,689 | 10/1995 | Hikichi | 365/189.09 |
| 5,485,430 | 1/1996 | McClure | 365/233 |
| 5,508,965 | 4/1996 | Nomura et al. | 365/206 |
| 5,555,521 | 9/1996 | Hamada et al. | 365/185.03 |
| 5,561,629 | 10/1996 | Curd | 365/185.21 |
| 5,596,539 | 1/1997 | Passow et al. | 365/210 |
| 5,608,681 | 3/1997 | Priebe et al. | 365/207 |
| 5,625,586 | 4/1997 | Yamasaki et al. | 365/104 |
| 5,636,161 | 6/1997 | Mann | 365/185.21 |
| 5,654,919 | 8/1997 | Kwon | 365/185.21 |
| 5,694,369 | 12/1997 | Abe | 365/210 |
| 5,699,295 | 12/1997 | Yero | 365/185.21 |

OTHER PUBLICATIONS

K. Ishibashi, et al., "*A 12.5–ns 16–Mb CMOS SRAM with Common–Centroid–Geometry–Layout Sense Amplifiers*", IEEE Journal of Solid–State Circuits, vol. 29, No. 4, Apr. 1994.

*Primary Examiner*—David C. Nelms
*Assistant Examiner*—Hien Nguyen
*Attorney, Agent, or Firm*—Hickman & Martine, LLP

[57] ABSTRACT

Disclosed is a method for amplifying a data signal read from a memory device. The method includes sensing an initial voltage difference across a data bus that is coupled to the memory device. Producing an initial voltage difference across a sensed data bus after the sensing detects the initial voltage difference. The initial voltage difference is configured to partially separate a pair of nodes associated with the sensed data bus. The method further includes subsequently isolating the data bus from the sensed data bus to rapidly further separate the pair of nodes associated with the sensed data bus, the rapid separation producing the amplified data signal across the sensed data bus.

31 Claims, 8 Drawing Sheets

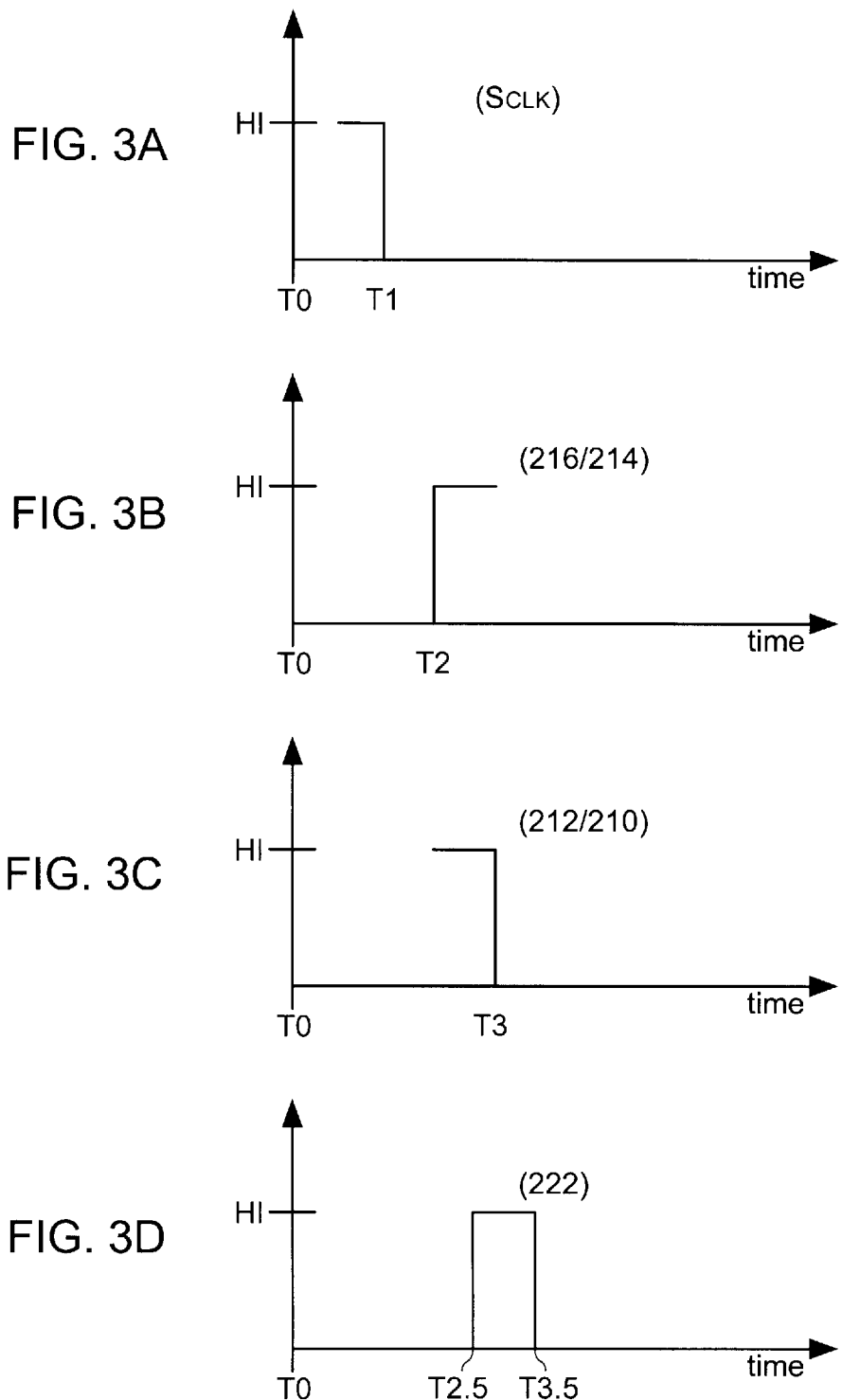

VOLTAGE SENSE AMPLIFIER AND METHODS FOR IMPLEMENTING THE SAME

BACKGROUND OF THE INVENTION

1. Field of the Invention

The present invention relates generally to integrated circuits, and more particularly to methods and apparatuses for amplifying signals sensed from selected memory locations.

2. Description of the Related Art

As is well known in the art, random access memory (RAM) devices are generally array structures composed of $2^n$ by $2^m$ individual RAM cells which are coupled to wordlines (rows) and complementary bit lines (columns). A typical RAM memory cell may be composed of between 4 and 6 transistors coupled together to form a data storage device. An individual RAM memory cell may be selected when an X-decoder is used to select rows and a Y-decoder is used to select columns. Typically, data is written into an individual RAM cell when the proper address is selected and a WRITE ENABLE circuitry allows digital data in the form of a differential voltage signal to be input into a selected memory cell location. As is well known in the art, once a specific memory cell is addressed within a RAM device and a READ ENABLE circuitry is active, a very small voltage amplitude representing the addressed digital data is sensed. However, to produce a readable voltage amplitude representing useful digital data, a sense amplifier is typically implemented to amplify the sensed signal.

FIG. 1 shows a conventional RAM block diagram used for outputting digital data stored within a RAM core 100. By way of example, when RAM core 100 includes 1,000 rows by 1,000 columns, RAM core 100 may be classified as a one megabit (1 MB) RAM storage device. In typical architectures, computers access RAM core 100 through an address input bus 110 that may be coupled to a conventional X-DECODER 102 and a conventional Y-DECODER 104. In general, X-DECODER 102 is used for addressing a selected row (wordlines) within RAM core 100, and Y DECODER 104 is used for addressing a selected column (bitlines) within RAM core 100. By way of example, X and Y decoders are generally implemented for reducing memory array aspect ratios by folding (i.e., dividing) long addressable memory columns into several shorter memory columns. Once folded into several columns, the X and Y decoders are capable of reading or writing the addressed data by appropriately performing a suitable multiplexing function.

Once a row and column is selected from RAM core 100, either a write or a read operation may be performed on the selected RAM memory cell. In order to perform a write operation, a write control circuit 107 is enabled which allows digital data to be input into a selected RAM memory cell via an input data bus 101. Generally, this digital data is in the form of a voltage waveform that represents either a logical "1" or a logical "0". Input buffer 109 amplifies a input signal 103 that is supplied by RAM input bus 111. In this manner, the selected transistors in RAM core 100 may be driven to an appropriate state.

In a like manner, once the row and column is selected in RAM core 100, a read operation may be performed which produces a voltage representing the addressed digital data on a data bus 112. At this point, the addressed digital data may be as low as about 50 milli-volts (mV). As described above, to appropriately read the addressed digital data, suitable amplification is typically performed in a sense amplifier 106.

Once the sensed data signal is amplified to full rail voltage level (i.e., about 3.3 volts or about 5 volts) in sense amplifier 106, the voltage amplified data is passed out as amplified data output 114 to an output buffer 108. At output buffer 108, the voltage amplified data 115 is current amplified to provide an appropriate level of current drive once the read data is passed to a RAM output bus 116.

There are a variety of well known conventional sense amplifiers 106, however, most conventional sense amplifiers 106 are not well optimized for performing fast read operations once data is sensed on data bus 112. In addition, conventional sense amplifiers are generally somewhat sluggish in recovering after the successful read operation has been performed. As is well known in the art, in order to perform a successful read/write operation, the nodes of a sensed data bus (i.e., SD and /SD) must be pulled apart somewhere between Vss (i.e., 0 volts) and $V_{CC}$ (i.e., 3.3 or 5 volts). That is, to accurately define a "1-bit" or a "0-bit", the sensed data (SD) node must be, for example, pulled towards $V_{CC}$, and the sensed data (/SD) node must be, for example, pulled towards $V_{SS}$. Unfortunately, most conventional sense amplifiers suffer in that SD and /SD are pulled apart too slow for speed sensitive applications.

Once SD and /SD are adequately pulled apart to complete a successful read operations, the sensed data nodes SD and /SD must be switched back to their original state (i.e., a ready to read state). That is, the nodes of the sensed data bus must be equalized (i.e., pulled back together) to their original voltage levels. Consequently, the next operation may not be performed until the nodes of the sensed data bus are equalized. It is therefore important to realize that most conventional sense amplifiers lack the ability to quickly amplify sensed data by rapidly pulling SD and /SD apart as well as the ability to rapidly restore the sensed data bus to its "ready" state.

In view of the foregoing, there is a needed for methods and apparatuses for rapidly amplifying sensed data signals read from memory locations. In addition, there is a need for methods and apparatuses for rapidly recovering a sense amplifier to a "ready to read" state after a previous operation is complete.

SUMMARY OF THE INVENTION

Broadly speaking, the present invention fills these needs by providing methods and apparatuses for increasing the amplification speed of a sense amplification system to enable faster and more accurate outputs of digital data sensed from a memory device, as well as increasing the rate of recovery after a sense amplification operation is complete. It should be appreciated that the present invention can be implemented in numerous ways, including as a process, an apparatus, a system, a device, or a method. Several embodiments of the present invention are described below.

In one embodiment, a method for amplifying a data signal read from a memory device is disclosed. The method includes sensing an initial voltage difference across a data bus that is coupled to the memory device, producing an initial voltage difference across a sensed data bus after the sensing detects the initial voltage difference. The initial voltage difference is configured to partially separate a pair of nodes associated with the sensed data bus. The method further includes subsequently isolating the data bus from the sensed data bus to rapidly further separate the pair of nodes associated with the sensed data bus, the rapid separation producing the amplified data signal across the sensed data bus.

In another embodiment, a method for amplifying a sensed voltage difference associated with a memory element of a memory device to obtain a data signal representing logical data stored in the memory element is disclosed. The method includes: (a) selecting the memory element of the memory device; (b) detecting a stored voltage value associated with the selected memory element of the memory device; and (c) amplifying the stored voltage value to produce the data signal representing logical data. The amplifying including, (i) monitoring the stored voltage value to detect the sensed voltage difference; (ii) initially amplifying the stored voltage value to produce a first voltage separation after the monitoring detects the sensed voltage difference, the first voltage separation being greater than the sensed voltage difference; and (iii) subsequently amplifying the stored voltage value to produce a second voltage separation after producing the first voltage separation, the second voltage separation being greater than the first voltage separation.

In yet another embodiment, a sense amplifying system for amplifying a sensed voltage difference associated with a memory element of a memory device is disclosed. The sense amplifying system includes a clock timing circuit for receiving a system clock signal indicative of a request to amplify the sensed voltage difference associated with the memory element of a memory device. The clock timing circuit is configured to output a first timing signal and a second timing signal. The sense amplifying system further includes a sense amplifier circuit for amplifying the sensed voltage difference. The amplifying is performed in a first precondition stage and a second rapid stage. The sense amplifier circuit initially receives the first timing signal to produce the first precondition stage, and a pulse generator for triggering the sense amplifier circuit to produce the second rapid stage after the first precondition stage has been performed.

Advantageously, the various embodiments of the present invention provide a method and apparatus for rapidly amplifying sensed voltage differences detected from an accessed memory location. By way of example, when a rising edge signal (i.e., signal line 216) is provided to an n-channel transistor (i.e., early turn on of transistor 506) contained within the sense amplifier, the sensed data bus /SD is caused to fall to the precondition voltage level (i.e., $V_{PC}$). After the early preconditioning occurs, the data bus is decoupled from the sensed data bus SD and /SD. Further, the various embodiments of the present invention advantageously increase the rate at which a sense amplification system recovers after a most recent amplification operation. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIGS. 3A through 3F provide preferred timing signals generated through the various functional blocks contained within the sense amplification system of FIG. 2 in accordance with one embodiment of the present invention.

DETAILED DESCRIPTION OF THE PREFERRED EMBODIMENTS

An invention for increasing the amplification speed of a sense amplification system to achieve a faster and more accurate output of data sensed from a specific memory location is disclosed. In addition, the invention provides methods and apparatuses for increasing the rate at which a sense amplification recovers after a recent sense amplification operation. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
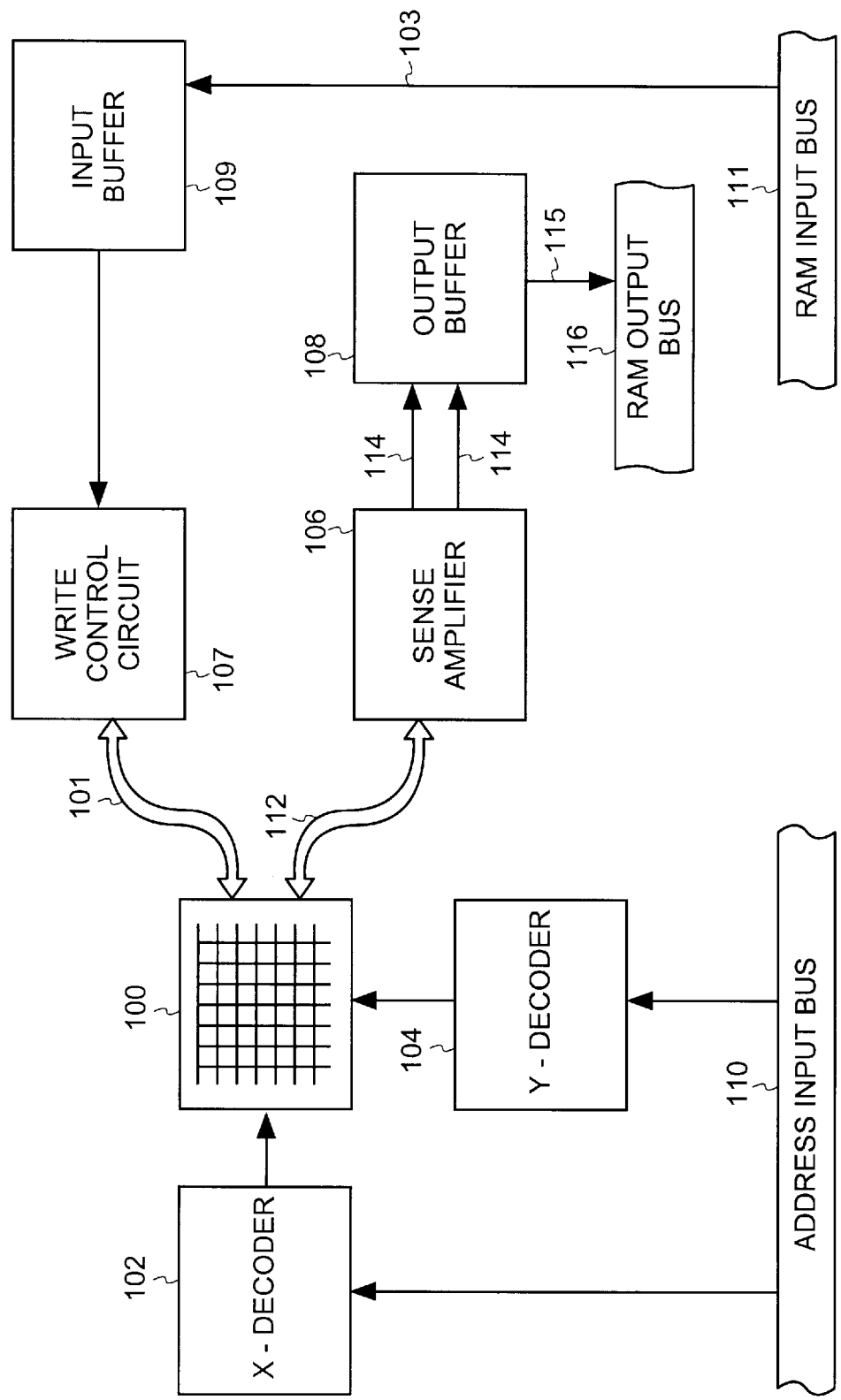
FIG. 1 shows a conventional memory addressing block diagram used for outputting digital data stored within a memory core.
Figure 2:
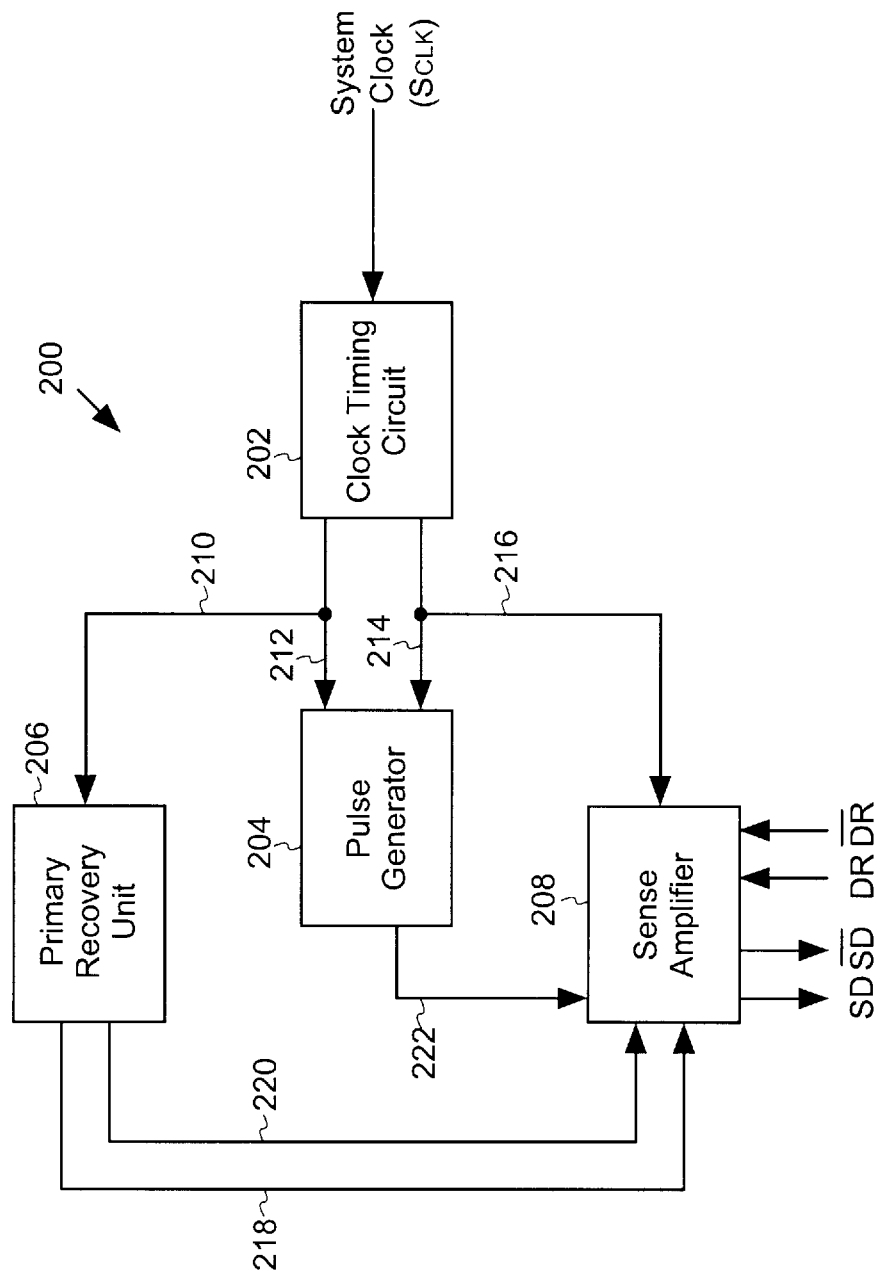
FIG. 2 is a functional block diagram of a sense amplification system used in memory reading operations in accordance with one embodiment of the present invention.

FIG. 2 is a functional block diagram of a sense amplification system 200 used in memory reading operations in accordance with one embodiment of the present invention. In one embodiment, a clock timing circuit 202 is preferably supplied with a system clock ($S_{CLK}$) for generating the appropriate timing signals used to trigger the various functional blocks associated with the sense amplification 200. As shown, clock timing circuit 202 preferably generates timing signals to a pulse generator 204 and a sense amplifier 208 via signal lines 214 and 216, respectively. In a like manner, clock timing circuit 202 provides timing signals to pulse generator 204 and a primary recovery unit 206 via signal lines 212 and 210, respectively.

In this embodiment, primary recovery unit 206 is preferably suited to turn off sense amplifier 208 once the selected memory location has been accessed and appropriate amplified through sense amplifier 208 has been completed. By way of example, primary recovery unit 206 preferably generates signals through signal lines 218 and 220 that are passed to sense amplifier 208 for triggering a rapidly turn-off and recovery that is configured to precharge the circuitry contained within the sense amplifier 208 after the desired logical data has been output from sense amplifier 208. In other words, once the desired logical data has been amplified through sense amplifier 208, the primary recovery unit 206 will assist in placing the circuitry contained within the sense amplifier 208 in its original "ready to read" state.

In this embodiment, sense amplifier 208 has terminals connected to a data bus that includes a data read (DR) line and a complementary data read (/DR) line. In operation, when a small difference in voltage (i.e., which may be about 50 mV) is detected by the data bus DR and /DR, sense amplifier 208 will provide a rapid substantially full rail gain of the detected voltage difference through a sense data bus that includes a sense data (SD) line and a complementary sense data (/SD) line. As will be described below in greater detail, clock timing circuit 202 is preferably well suited to provide a rising edge signal (e.g., through signal line 216) to sense amplifier 208 for generating a precondition gain between SD and /SD. Once a precondition gain is provided between SD and /SD, a more rapid full rail gain is generated by sense amplifier 208.

Further shown is a signal line 222 being output from pulse generator 204 and leading to sense amplifier 208. In one embodiment, signal line 222 provides a suitable pulse for isolating DR from SD, and /DR from /SD to effectively lower the capacitance of SD and /SD. Once the capacitance for SD and /SD is lowered, SD and /SD will be allowed to more rapidly separate and define the logical data stored in the memory location being read.

Once a successful read operation has been completed, sense amplifier 208 must be placed back to its original "ready to read" state. As described above, primary recovery unit 206 provides timed signals through signal lines 218 and 220 to rapidly place sense amplifier 208 to its original "ready to read" state. Once the data has been amplified to about full rail as defined by the difference in voltage experienced by SD and /SD, primary recovery unit 206 will preferably provide a rising edge through signal line 218. As will be described in greater detail below, the rising edge of signal line 218 is preferably configured to place an intermediate precharge node (i.e., node 530 of FIG. 5) contained within sense amplifier 208 to a preconditioned voltage (Vpcn) through an NMOS transistor. After providing signal line 218 to sense amplifier 208, primary recovery unit 206 provides a falling edge through signal line 220 to assist in equalizing SD and /SD to their initial ready to read state.

Figure 3E:
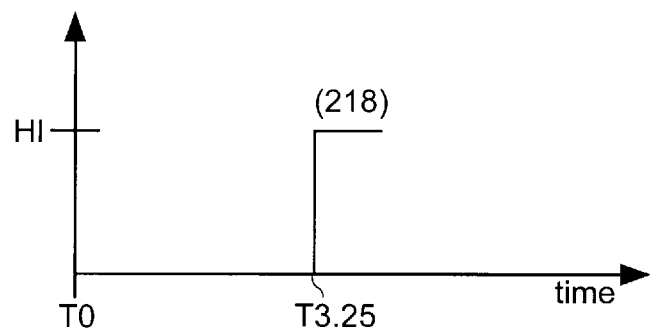

FIGS. 3A through 3F provide the preferred timing signals generated through the various functional blocks contained within sense amplification system 200 of FIG. 2 in accordance with one embodiment of the present invention. FIG. 3A shows a falling edge signal generated when system clock ($S_{CLK}$) falls at a time $T_1$. In response to receiving a falling system clock at time $T_1$, clock timing circuit 202 of FIG. 2 preferably outputs a rising edge signal at a time $T_2$ as shown in FIG. 3B. In this embodiment, about one-gate delay is preferably lapsed between $T_1$ and $T_2$, and the rising edge provided at $T_2$ is supplied to sense amplifier 208 via signal line 216, and supplied to pulse generator 204 via signal line 214. As mentioned above, the rising edge provided through signal line 216 is preferably well suited to precondition sense amplifier 208 to advantageously enable an early voltage precondition and separation of SD and /SD. As will be appreciated to those skilled in the art, when SD and /SD are voltage preconditioned early, data is amplified faster, thereby allowing a faster read of data stored in the memory location being accessed.

FIG. 3C shows a falling edge at a time $T_3$ which is generated by clock timing circuit 202 and provided to pulse generator 204 and primary recovery unit 206 via signal lines 212 and 210, respectively. As described above, primary recovery unit 206 functions at the latter stage of a reading operation to precharge sense amplifier 208 after a successful reading operation has been completed. FIG. 3D shows a rising edge at a time $T_{2.5}$ which is provided to sense amplifier 208, from pulse generator 204, after sense amplifier 208 has been preconditioned by the aforementioned rising edge of signal line 216. In general, the rising edge at $T_{2.5}$ of FIG. 3D preferably occurs within about two gate delays after the rising edge at $T_2$ of FIG. 3B.

In this embodiment, the falling edge illustrated in FIG. 3D is shown occurring at a time $T_{3.5}$ that is preferably defined two gate delays after $T_3$ of FIG. 3C. Accordingly, a pulse width defined by the rising edge and falling edge of signal line 222 of FIG. 3D is preferably about three gate delays in width. Once the falling edge occurs at $T_{3.5}$ for signal line 222, the amplification of the sensed data will have been completed and the sense amplification system 200 of FIG. 2 will rapidly cycle through a recovery process.

Figure 3F:
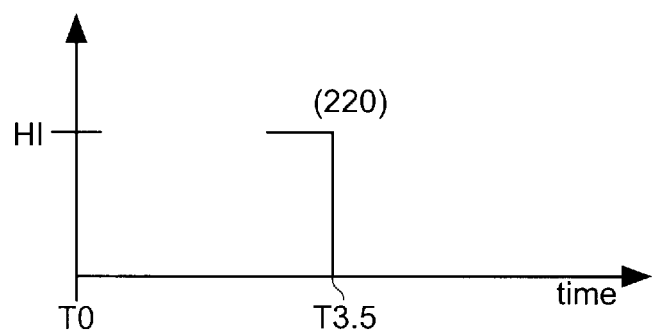

FIG. 3E shows a rising edge at a $T_{3.25}$ which is about one gate delay after $T_3$ of FIG. 3C. In this embodiment, the rising edge at $T_{3.25}$ is preferably configured to supply a HIGH signal via signal line 218 to sense amplifier 208, which essentially activates the aforementioned recovery process. Next, FIG. 3F shows a falling edge occurring at a time $T_{3.5}$ which is configured to provide a LOW signal via signal line 220 to sense amplifier 208, from the primary recovery unit 206. Preferably, the falling edge at $T_{3.5}$ for signal line 220 is about one gate delay after $T_{3.25}$. As described above, a rising edge is provided at time $T_{3.25}$ through signal line 218.

Figure 4:
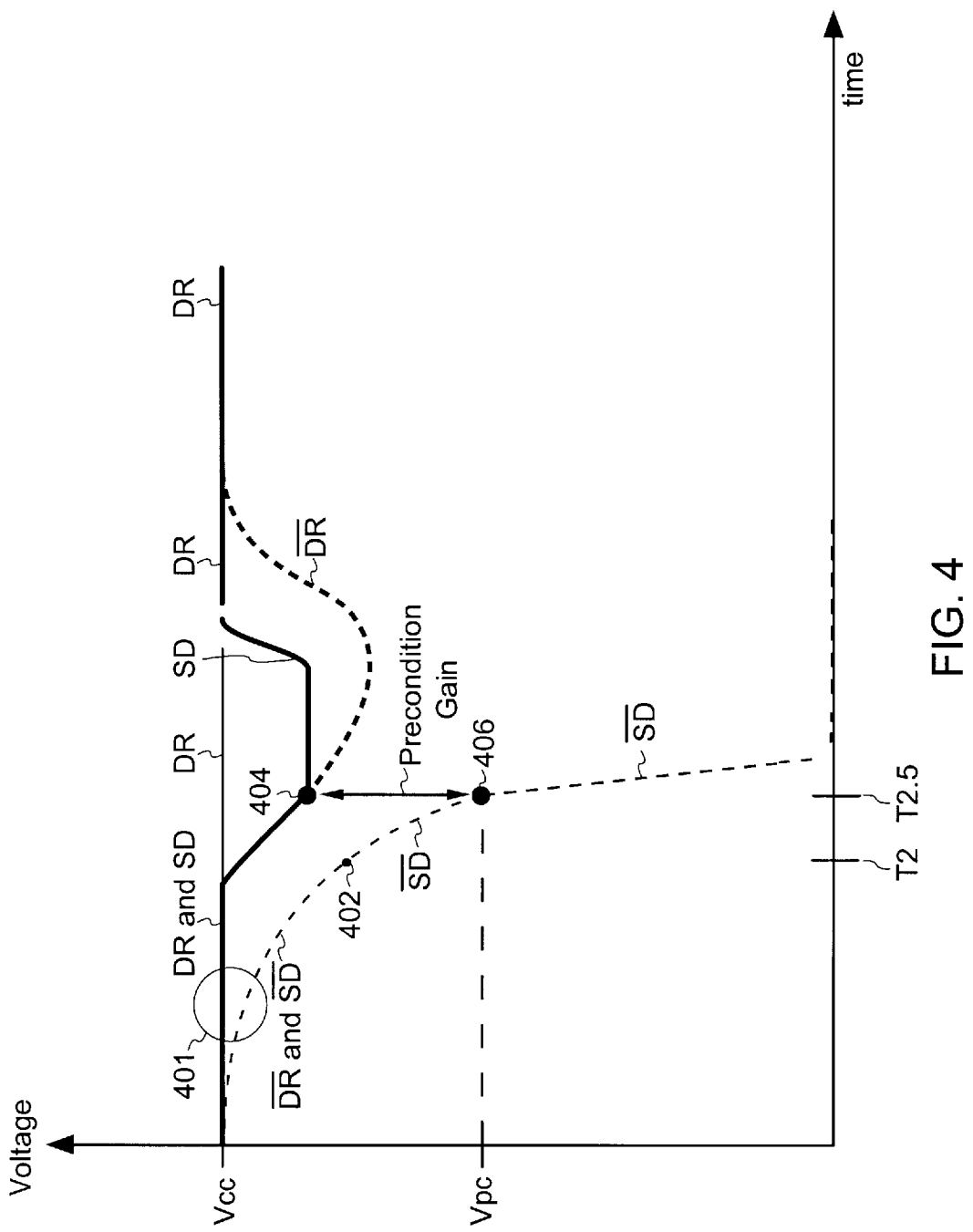
FIG. 4 is a graphical representation of the rapid response of the sense amplification system in accordance with one embodiment of the present invention.

FIG. 4 is a graphical representation of the rapid response of sense amplification system 200 in accordance with one embodiment of the present invention. Once a sufficient voltage difference between DR and /DR is present on the data bus coupled to sense amplifier 208, and system clock ($S_{CLK}$) produces a falling edge as shown in FIG. 3A, the sense amplification system 200 will be ready to amplify the accessed data. By way of example, DR is shown separated from /DR by about 50 mV at point 401, which is indicative of a sensed voltage difference.

As described above, at time $T_2$, signal line 216 will provide a rising edge, signal line 220 of FIG. 3F will be at a HIGH state (i.e., signal line 220 is already preconditioned to a HIGH state at time $T_2$), and signal line 218 will be at a LOW state. When these conditions are present at a time $T_2$, the ground supply to sense amplifier 208 is essentially enabled. As a result, the internal nodes of sense amplifier 208 (i.e., SD and /SD) will separate to provide a voltage difference of about 100 mV between a point 404 and a point 406. Specifically, the exemplary plotted curve of sensed data /SD will rapidly decreases in voltage beginning at a point 402 to a point 406, while sensed data SD decreases in voltage at a slower rate down to a point 404.

As graphically illustrated, the voltage difference between point 404 and point 406 (i.e., on SD and /SD, respectively) represents a preconditioned gain that advantageously assists sense amplifier 208 in attaining a full-rail gain between point 406 and $V_{SS}$ at a substantially faster rate. That is, /SD will preferably fall at a very fast rate between $T_2$ and $T_{2.5}$. Further, SD will preferably fall at a slower rate between $T_2$ and $T_{2.5}$, and then flatten out after point 404. It should therefore be appreciated that signal lines 214 and 216 that are output from clock timing circuit 202 to pulse generator 204 and sense amplifier 208 advantageously assist in lowering the common mode voltage of SD and /SD. This preferably causes the sense amplifier transistors that complete the full rail voltage separation of nodes SD and /SD to operate under bias conditions that provide the highest possible drive. Further, at time $T_{2.5}$, signal line 222 goes HIGH as shown in FIG. 3D, which causes the isolation of DR from SD, and /DR from /SD. When this happens, the effective capacitance on SD and /SD is effectively lowered which thereby advantageously allows SD and /SD to separate completely at the rapid illustrated rate.

It is important to note that sense amplifier 208 advantageously receives signal line 222 at $T_{2.5}$ when /SD is at a lower voltage level, which may be contrasted with prior art designs that present /SD at a much higher voltage level when signal line 222 is applied. Because signal line 222 of prior art designs see a much higher voltage level for /SD, the resulting amplification of /SD down to $V_{SS}$ disadvantageously occurs at a much slower rate than may be acceptable for speed sensitive applications. Accordingly, by preconditioning /SD to a precondition voltage $V_{PC}$ at point 406, a much rapid full rail gain is produced by time $T_{2.5}$.

Once SD and /SD are separated to provide the aforementioned substantially full rail gain between point 406 and $V_{SS}$, a clearly defined logical value may be read out from sense amplifier 208 in accordance with one embodiment of the present invention. Therefore, it is important to realize that the rising edge provided by signal line 222, to sense amplifier 208, will advantageously assist in rapidly separating SD and /SD once sense amplifier 208 has been placed in the preconditioned state. The rising edge provided by signal line 216 is well suited to lower /SD to the preconditioned voltage ($V_{PC}$) at point 406. Further, the rising edge provided by signal line 214 causes the rising edge output by signal line 222 from pulse generator 204. Therefore, signal line 222 acts to effectively isolate the sense amplifier 208 from the data bus (i.e., DR and /DR).

It is also important to note that the preconditioned gain illustrated between points 404 and 406 assist in pulling up SD towards $V_{CC}$ at a much faster rate because sense amplifier 208 is operating in a better operating region. Further, by increasing the separation of SD and /SD, the noise margin is substantially improved which advantageously allows for a more clear definition of the sensed data. After point 404, /DR, being isolated from SD and /SD begins to recover to place sense amplifier 208 in a ready state for the next read operation. This DR recovery is preferably done by circuits external to the sense amplifier 208.

Figure 5A:
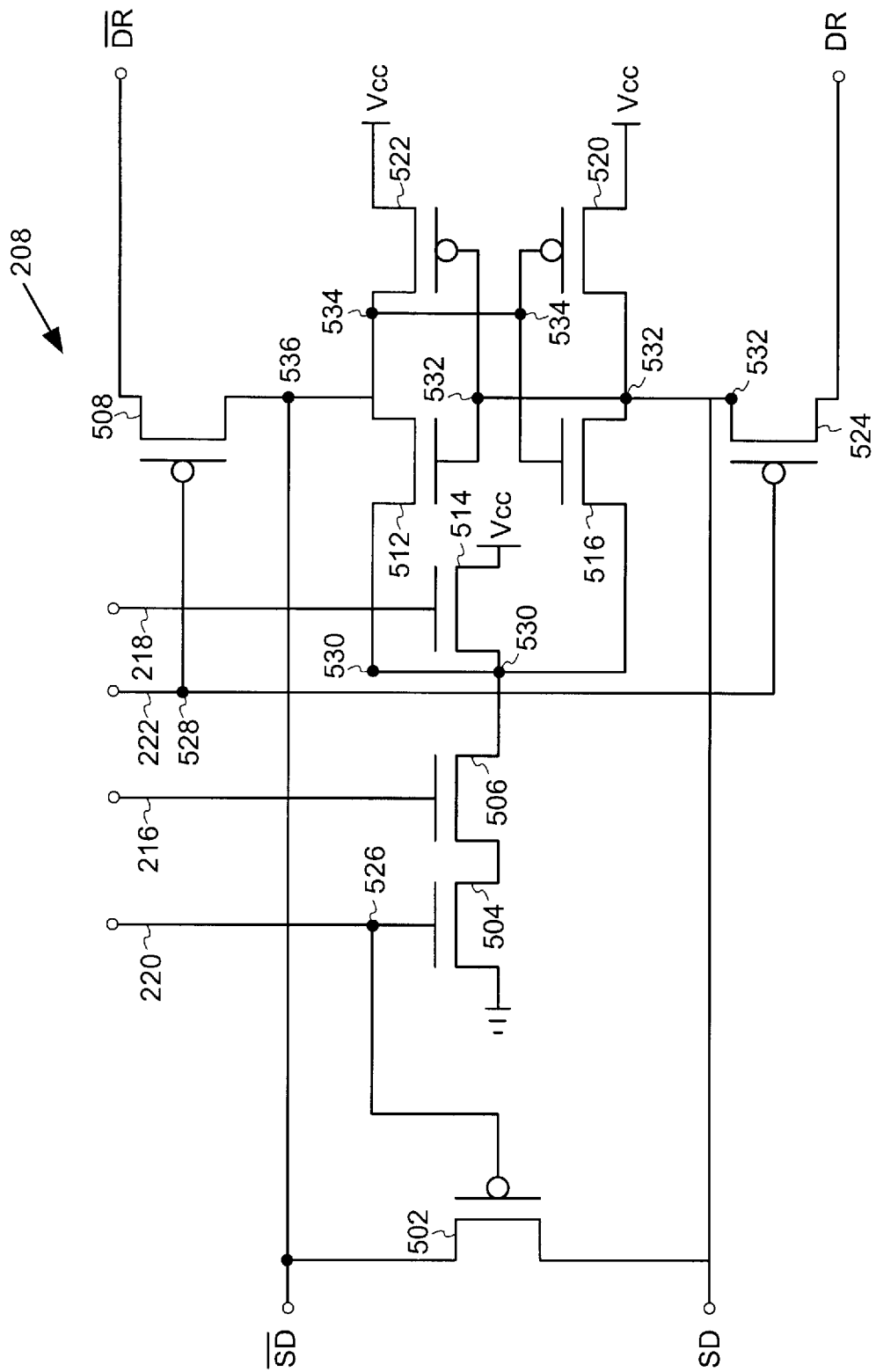
FIG. 5A is a circuit diagram of the preferred electrical interconnections contained within the sense amplifier in accordance with one embodiment of the present invention.

FIG. 5A is a circuit diagram of the preferred electrical interconnections contained within sense amplifier 208 in accordance with one embodiment of the present invention. As shown, /SD and SD are coupled to the source and drain terminals respectively, of a p-channel transistor 502, and the gate of transistor 502 is coupled to a node 526. Node 526 connects the gate of an n-channel transistor 504, and signal line 220. Transistor 504 preferably has the source terminal connected to ground, and the drain terminal connected to the source terminal of an n-channel transistor 506. The gate of transistor 506 is coupled to signal line 216, and the drain terminal of transistor 506 is coupled to a node 530, which in turn is coupled to the drain terminal of transistor 514. The gate of transistor 514 is coupled to signal line 218.

Node 530 also defines an electrical connection to the source terminals of n-channel transistors 512 and 516. Node 532 then defines the electrical connection to the drain terminals of transistors 516, 520 and 524, as well as the gates of transistors 512, and 522. In a like manner, node 536 defines an electrical connection to the drain terminals of transistors 508, 512 and 522, as well as defining gate connections to transistors 520 and 516. Further, signal line 222 is coupled to a node 528 that connects to the gate of p-channel transistor 508, as well as the gate of p-channel transistor 524.

The operation of sense amplifier 208 will preferably be described with reference to the timing diagrams provided in FIGS. 3A through 3F. At time $T_2$, transistor 506 is supplied with a rising edge through signal line 216 as shown in FIG. 3B, which effectively turns on transistor 506. When transistor 506 is turned on at $T_2$, node 530 begins to be pulled down to ground (i.e., $V_{SS}$). Once node 530 is pulled down towards ground, nodes 532 and 536, which are coupled to SD and /SD, are likewise pulled down towards ground along with node 530.

While node 530 continues down towards ground, node 536 will rapidly decline to the precondition voltage $V_{PC}$. As shown in FIG. 4 above, the more rapid decline of node 536 will cause /SD to fall towards $V_{PC}$ at a faster rate than SD, thereby establishing a precondition gain (i.e., about 100 milli-volts) between SD and /SD at points 404 and 406, respectively. In one embodiment, the precondition gain may be between about 30 mV and about 400 mV. At time $T_{2.5}$, signal line 222 preferably rises as shown in FIG. 3D, thereby turning off transistors 508 and 524. When transistors 508 and 524 are turned off, /SD is isolated from /DR, and SD is isolated from DR. Preferably, transistor 520 is well suited to pull up SD after transistor 524 isolates SD from DR. Therefore, just after time $T_{2.5}$, the slope of /SD rapidly accelerates down to $V_{SS}$ to define a substantially full rail gain. Once transistor 508 turns off, transistor 512 will be configured to short /SD to node 530 which is currently at $V_{SS}$. In this embodiment, transistors 512, 522, 516, and 520 are preferably implemented for sensing the aforementioned voltage difference detected from the accessed memory location (i.e., accessed through the data bus DR and /DR). It is important to realize that the "early" turn on of transistor 506 connects node 530 to a voltage source $V_{SS}$ that therefore pulls down /SD to the aforementioned preconditioned voltage level ($V_{PC}$). After the early preconditioning and separation occurs, the data bus is then decoupled from the sensed data bus SD and /SD.

Figure 5B:
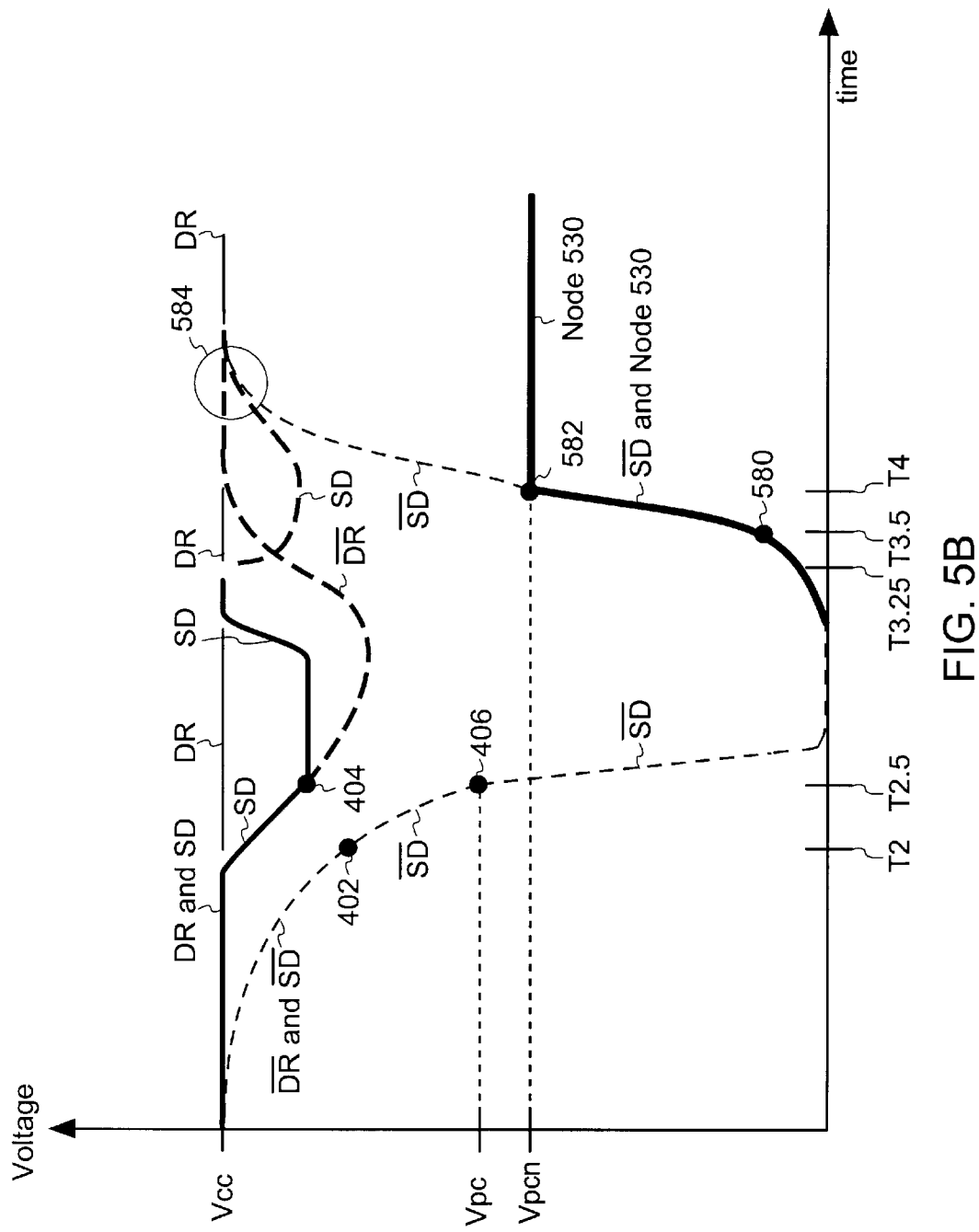
FIG. 5B illustrates the rapid recovery transitions of the sense amplification system of FIG. 2 in response to the signals provided by the primary recovery unit in accordance with one embodiment of the present invention.

In its recovery state, at time $T_{3.25}$ as shown in FIG. 3E, signal line 218 provides a rising edge signal to the gate of transistor 514, thereby turning on transistor 514. In this embodiment, the turn on of transistor 514 is configured to causes node 530 to rise towards a precharged voltage ($V_{PCN}$). Further, the rising edge of signal line 218 causes /SD to rise together with node 530 up to voltage $V_{PCN}$ as shown in FIG. 5B below. At time $T_{3.5}$, signal line 220 experiences a falling edge which acts to rapidly turn off transistor 504 to avoid crowbar current at node 530 through transistor 514 and 504. Accordingly, the turn off of transistor 504 assists in allowing node 530 to rapidly progress up to $V_{PCN}$.

At a time $T_{3.5}$, transistor 502 is caused to turn on when the low signal provided to node 526 is applied to the gate of transistor 502. In this manner, /SD is caused to come together with SD, thereby equalizing SD and /SD at a point 584 as shown in FIG. 5B. At about substantially the same time $T_{3.5}$, node 528 causes transistors 508 and 524 to turn on, thereby coupling SD and DR, and /SD and /DR. By coupling SD and DR, and /SD and /DR, sense amplifier 208 is allowed to rapidly revert back to its original "ready to read" state. That is, because DR is already at a high voltage level (i.e., about $V_{CC}$), SD will be pushed towards $V_{CC}$. In a like manner, because /DR is currently near $V_{CC}$, /SD will be pulled towards $V_{CC}$. In general, SD and /SD are caused to equalize up to the "ready to read" voltage level (i.e., $V_{CC}$). Because sense amplifier 208 is placed back to its original "ready to read" voltage level at a substantially faster rate, the sense amplification system 200 of FIG. 200 will advantageously be ready to read data from the next memory location much faster than conventional systems.

In one embodiment, the fast recovery is assisted by precharging node 530 with specialized recovery transistors 514 and 504. It is also important to note that although the recovery is fast, few devices and loads are connected to the sensed data bus SD and /SD. Once the sensed data bus SD and /SD has been coupled to the data bus during a recovery operation, the equalization of SD and /SD is preferably triggered from "inside" the sense amplifier 208 with the aid of transistor 502. In contrast, the precharging of the sensed data bus SD and /SD is triggered from "outside" of sense amplifier 208 when the data bus precharges SD and /SD through transistors 508 and 524.

FIG. 5B therefore illustrates the recovery transitions of sense amplification system 200 of FIG. 2 in response to the signals provided by the primary recovery unit 206 in accordance with one embodiment of the present invention. As described above, /SD and node 530 are caused to ramp up together up to $V_{PCN}$, at time $T_4$ defined at point 582. At time $T_{3.5}$, when transistor 502 of FIG. 5A turns on in response to the low voltage signal provided through signal line 220, /SD and SD are caused to equalize starting at $T_{3.5}$. When transistor 504 is turned off in response to the low signal provided by signal line 220, the fight between transistor 514 and transistor 504 at node 530 is eliminated. When the fight is eliminated, node 530 is allowed to more rapidly rise to $V_{PCN}$.

Figure 6:
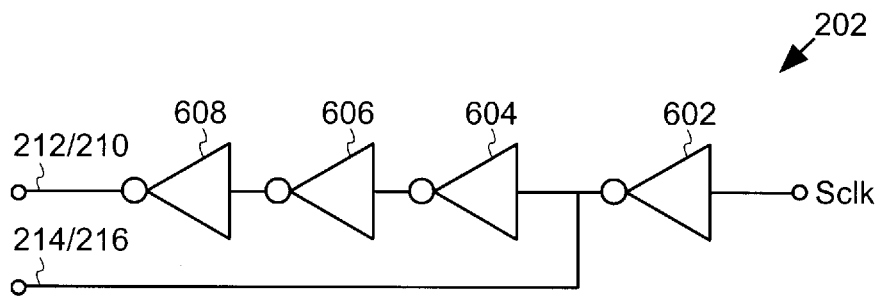
FIG. 6 is a circuit diagram of the circuit elements contained within the clock timing circuit of FIG. 2 in accordance with one embodiment of the present invention.

FIG. 6 is a circuit diagram of the circuit elements contained within clock timing circuit 202 of FIG. 2 in accordance with one embodiment of the present invention. As shown, system clock ($S_{CLK}$) is initially provided to an inverter 602 which outputs an inverted signal to signal lines 214 and 216. The signal inverted by inverter 602 is then inverted three more times at inverters 604, 606 and 608. In this manner, the signal provided to signal lines 212 and 210 have the identical phase of $S_{CLK}$ with four gates of delay to accomplish the desired timing. Of course, other suitable timing delay circuits may be implemented as well.

Figure 7:
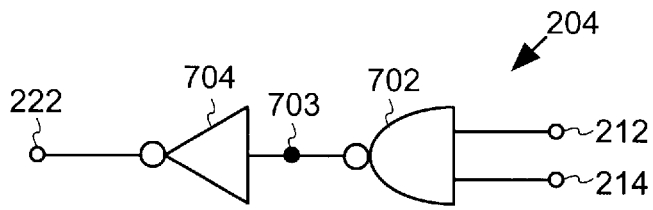
FIG. 7 is a circuit diagram of the circuit elements contained within the pulse generator in accordance with one embodiment of the present invention.

FIG. 7 is a circuit diagram of the circuit elements contained within pulse generator 204 in accordance with one embodiment of the present invention. A NAND gate 702 is shown having two inputs provided by signal lines 212 and 214, and an output fed to a node 703. Node 703 preferably defines the input to an inverter 704. The output of inverter 704 is shown to be signal line 222 as described above with reference to FIG. 2. In operation, at a time $T_2$, signal line 214 is caused to experience a rising edge while signal line 212 is already at a high state as shown in FIG. 3C.

Therefore, when signal line 212 and signal line 214 are high, a low is output to node 703 which is inverted as a high signal to signal line 222. On the other hand, if signal lines 212 and 214 are either "low and high," or "high and low," respectively, a high signal will be provided to node 703 which is then inverted to produce a low signal at signal line 222. Accordingly, the NAND gate 702 and inverter 704 of pulse generator 204 preferably act as an "AND gate."

Figure 8:
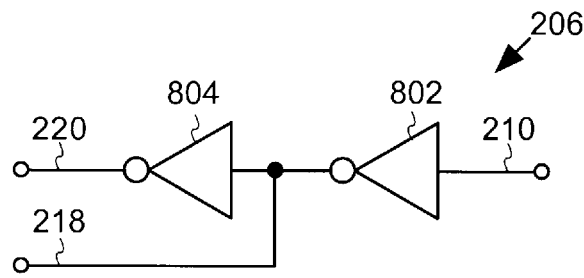
FIG. 8 is a circuit diagram of the circuit elements contained within the primary recovery unit in accordance with one embodiment of the present invention.

FIG. 8 is a circuit diagram of the circuit elements contained within the primary recovery unit 206 in accordance with one embodiment of the present invention. As shown, a signal line 210, which is received from clock timing circuit 202 of FIG. 2, is provided to an inverter 802. Inverter 802 then provides an inverted signal to signal line 218, which leads to sense amplifier 208. Inverter 802 also provides an input to inverter 804, which inverts the signal output from inverter 802 to provide an output to signal line 220. Accordingly, signal line 220 is essentially at the same phase as signal line 210 with two gate delays for timing purposes.

Although the foregoing invention has been described in some detail for purposes of clarity of understanding, it will be apparent that certain changes and modifications may be practiced within the scope of the appended claims. It should be understood that the various circuit diagrams may be embodied in any form which may include, for example, any suitable semiconductor substrate, printed circuit board, packaged integrated circuit, or software implementation. Accordingly, the present embodiments are to be considered as illustrative and not restrictive, and the invention is not to be limited to the details given herein, but may be modified within the scope and equivalents of the appended claims.

What is claimed is:

1. A method for amplifying a data signal read from a memory device, comprising:

sensing an initial voltage difference across a data bus coupled to the memory device;

producing an initial voltage difference across a sensed data bus after the sensing detects the initial voltage difference, the initial voltage difference being configured to partially separate a pair of nodes associated with the sensed data bus; and subsequently isolating the data bus from the sensed data bus to rapidly further separate the pair of nodes associated with the sensed data bus to produce the amplified data signal across the sensed data bus.

2. A method for amplifying a data signal as recited in claim 1, wherein the isolating of the data bus from the sensed data bus is configured to produce a fast substantially fall rail gain when the pair of nodes associated with the sensed data bus produces the amplified data signal.

3. A method for amplifying a data signal as recited in claim 1, wherein the isolating the data bus from the sensed data bus is caused when the pair of nodes associated with the sensed data bus and a second pair of nodes associated with the data bus are electrically decoupled.

4. A method for amplifying a data signal as recited in claim 3, wherein the isolating occurs after a common mode voltage of the pair of nodes associated with the sensed data bus is lowered.

5. A method for amplifying a data signal as recited in claim 2, wherein the pair of nodes associated with the sensed data bus include an SD node and an /SD node.

6. A method for amplifying a data signal as recited in claim 5, wherein the second pair of nodes associated with the data bus include a DR node and a /DR node.

7. A method for amplifying a data signal as recited in claim 6, further comprising:

outputting the amplified data signal within about 2 gate delays after producing the initial voltage difference.

8. A method for amplifying a data signal as recited in claim 7, wherein the initial voltage difference is between about 30 mV and about 400 mV, the initial voltage difference is defined between SD and /SD.

9. A method for amplifying a data signal as recited in claim 8, wherein when the fast produced substantially fall rail gain causes one of SD and /SD to rapidly fall to a low rail voltage $V_{SS}$.

10. A method for amplifying a data signal as recited in claim 1, further comprising:

precharging the sensed data bus to enable a fast recovery of the sensed data bus;

electrically coupling the data bus to the sensed data bus; and coupling the pair of nodes associated with sensed data bus to assist in rapidly equalizing the sensed data bus to a ready to read state.

11. A method for amplifying a data signal as recited in claim 10, further comprising:
    amplifying a next data signal after the sensed data bus has been rapidly equalized to the ready to read state.

12. A method for amplifying a data signal as recited in claim 11, wherein the electrically coupling occurs within about three gate delays after isolating data bus from the sensed data bus.

13. A method for amplifying a data signal as recited in claim 12, wherein the method operations are used to make a sense amplifier.

14. A method for amplifying a sensed voltage difference associated with a memory element of a memory device to obtain a data signal representing logical data stored in the memory element, comprising:
    (a) selecting the memory element of the memory device;
    (b) detecting a stored voltage value associated with the selected memory element of the memory device; and
    (c) amplifying the stored voltage value to produce the data signal representing logical data, the amplifying including,
        (i) monitoring the stored voltage value to detect the sensed voltage difference;
        (ii) initially amplifying the stored voltage value to produce a first voltage separation after the monitoring detects the sensed voltage difference, the first voltage separation being greater than the sensed voltage difference;
        (iii) subsequently amplifying the stored voltage value to produce a second voltage separation after producing the first voltage separation, the second voltage separation being greater than the first voltage separation.

15. A method for amplifying a sensed voltage difference as recited in claim 14, wherein a sum of the first voltage separation and the second voltage separation produces a substantially full rail voltage gain, the substantially full rail gain being configured to produce substantially noise free logical data.

16. A method for amplifying a sensed voltage difference as recited in claim 15, wherein when the initial amplifying is performed to produce the first voltage separation, the second voltage separation is rapidly completed within about 2 gate delays.

17. A method for amplifying a sensed voltage difference as recited in claim 14, wherein the first voltage separation is between about 30 mV and about 400 mV.

18. A method for amplifying a sensed voltage difference as recited in claim 15, wherein the monitoring of the stored voltage value to detect the sensed voltage difference is accomplished across a data bus having a DR node and a /DR node.

19. A method for amplifying a sensed voltage difference as recited in claim 18, wherein the first voltage difference and the second voltage difference is measured across a sensed data bus having an SD node and an /SD node.

20. A method for amplifying a sensed voltage difference as recited in claim 19, wherein the second voltage difference is caused after the data bus is caused to be electrically decoupled from the sensed data bus.

21. A method for amplifying a sensed voltage difference as recited in claim 20, wherein when the data bus is caused to be electrically decoupled from the sensed data bus, a common mode voltage of the SD and /SD nodes are effectively lowered due to an early turn on caused by the initial amplifying.

22. A method for amplifying a sensed voltage difference as recited in claim 21, wherein when the common mode voltage of the SD and /SD nodes are effectively lowered, one of the SD and /SD nodes is caused to rapidly fall to a low rail voltage $V_{SS}$.

23. A method for amplifying a sensed voltage difference as recited in claim 20, further comprising:
    precharging the sensed data bus to enable a fast recovery of the sensed data bus;
    electrically recoupling the data bus to the sensed data bus; and
    electrically coupling the SD and /SD nodes to assist in rapidly equalizing the sensed data bus to a ready to read state.

24. A method for amplifying a sensed voltage difference as recited in claim 23, further comprising:
    amplifying a next stored voltage value after the sensed data bus has been rapidly equalized to the ready to read state.

25. A method for amplifying a sensed voltage difference as recited in claim 24, wherein the electrically recoupling occurs within about three gate delays after the data bus is caused to be electrically decoupled from the sensed data bus.

26. A method for amplifying a sensed voltage difference as recited in claim 25, wherein the method operations are used to make a sense amplifier.

27. A sense amplifying system for amplifying a sensed voltage difference associated with a memory element of a memory device to obtain a data signal representing logical data stored in the memory element, the sense amplifying system comprising:
    a clock timing circuit for receiving a system clock signal indicative of a request to amplify the sensed voltage difference associated with the memory element of the memory device, the clock timing circuit being configured to output a first timing signal and a second timing signal;
    a sense amplifier circuit for amplifying the sensed voltage difference, the amplifying being performed in a first precondition stage and a second rapid stage, the sense amplifier circuit initially receiving the first timing signal to produce the first precondition stage; and
    a pulse generator for triggering the sense amplifier circuit to produce the second rapid stage after the first precondition stage has been performed.

28. A sense amplifying system for amplifying a sensed voltage difference as recited in claim 27, further comprising:
    primary recover unit for causing a rapid recovery of the sense amplifier circuit, the rapid recover being performed through a first precharging state and a second rapid charging state, the primary recover unit being configured to produce the first precharging state after receiving the second timing signal from the clock timing circuit.

29. A sense amplifying system for amplifying a sensed voltage difference as recited in claim 28, wherein the primary recovery unit outputs a first recovery signal and a second recovery signal to the sense amplifier circuit, the first and second recover signals cause the first precharging state.

30. A sense amplifying system for amplifying a sensed voltage difference as recited in claim 29, wherein the pulse generator is configured to cause the second rapid charging state in response to receiving the second timing signal output from the clock timing circuit.

31. A sense amplifying system for amplifying a sensed voltage difference as recited in claim 30, wherein the second rapid charging state quickly places the sense amplifier in a ready to read state.

* * * * *